(12) United States Patent
Ishii et al.

(10) Patent No.: US 11,169,337 B2
(45) Date of Patent: Nov. 9, 2021

(54) OPTICAL MODULE AND OPTICAL TRANSMISSION EQUIPMENT

(71) Applicant: Lumentum Japan, Inc., Kanagawa (JP)

(72) Inventors: Hiroyoshi Ishii, Kanagawa (JP); Tetsuya Aoki, Kanagawa (JP); Koichi Takahashi, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 16/834,817

(22) Filed: Mar. 30, 2020

(65) Prior Publication Data

US 2020/0326494 A1    Oct. 15, 2020

(30) Foreign Application Priority Data

Apr. 12, 2019  (JP) .............................. JP2019-076532

(51) Int. Cl.
| | |
|---|---|
| *G02B 6/42* | (2006.01) |
| *H05K 7/14* | (2006.01) |
| *H04B 10/40* | (2013.01) |
| *H05K 7/20* | (2006.01) |
| *H04B 10/25* | (2013.01) |

(52) U.S. Cl.
CPC .......... *G02B 6/4269* (2013.01); *G02B 6/426* (2013.01); *G02B 6/4246* (2013.01); *H04B 10/40* (2013.01); *H05K 7/14* (2013.01); *H05K 7/2039* (2013.01); *H04B 10/25891* (2020.05)

(58) Field of Classification Search
CPC .... G02B 6/4269; G02B 6/4246; G02B 6/426; H05K 7/14; H05K 7/2039; H04B 10/40; H04B 10/25891
See application file for complete search history.

(56) References Cited

U.S. PATENT DOCUMENTS

| | | | | |
|---|---|---|---|---|
| 7,561,805 | B2 * | 7/2009 | Aoki ................... | G02B 6/4204 398/182 |
| 9,172,468 | B2 * | 10/2015 | Kurashima .......... | G02B 6/4272 |
| 2018/0172930 | A1 * | 6/2018 | Kanda ................ | H04B 10/503 |
| 2020/0112373 | A1 * | 4/2020 | Lai ....................... | G02B 6/4269 |

FOREIGN PATENT DOCUMENTS

JP    2016-006927 A    1/2016

* cited by examiner

*Primary Examiner* — Mukundbhai G Patel
(74) *Attorney, Agent, or Firm* — Harrity & Harrity, LLP

(57) ABSTRACT

An optical module includes at least one optical sub-assembly; at least one control circuit configured to control the at least one optical sub-assembly; and a housing including a first case and a second case, wherein the optical module is configured to be plugged in and unplugged from an optical transmission equipment including a heat sink provided at a joining portion with the first case, wherein, through fitting of the first case and the second case, the housing accommodates the at least one optical sub-assembly and the at least one control circuit inside the housing, and wherein a material of the first case has a thermal conductivity higher than a material of the second case.

20 Claims, 7 Drawing Sheets

FIG.5

| MATERIAL | THERMAL CONDUCTIVITY | PROCESSING METHOD |
|---|---|---|
| ALUMINUM ALLOY (A5052) | 138 W/mK | MACHINING |
| ALUMINUM ALLOY (ADC12) | 92 W/mK | DIE-CASTING , MACHINING |
| ZINC ALLOY(ZAMAK3) | 113 W/mK | DIE-CASTING , MACHINING |
| COPPER | 400 W/mK | MIM , MACHINING |

OPTICAL MODULE AND OPTICAL TRANSMISSION EQUIPMENT

CROSS-REFERENCE TO RELATED APPLICATION

The present application claims priority from Japanese patent application JP 2019-076532 filed on Apr. 12, 2019, which is hereby expressly incorporated by reference herein.

TECHNICAL FIELD

The present disclosure relates to an optical module and an optical transmission equipment, and more particularly, to a technology of enhancing heat radiation performance by a simple method.

BACKGROUND

An optical module has at least one of an optical transmission function or an optical reception function. In general, such an optical module is mounted to an optical transmission equipment. In view of a working process for mounting the optical module, there has been widely used, as the optical module, a pluggable module which can be plugged in and unplugged from the optical transmission equipment.

In general, in order to achieve the optical transmission function and the optical reception function, the optical module includes one or a plurality of optical sub-assemblies (OSA). Moreover, the optical module further includes one or a plurality of control circuits (for example, IC), and the one or the plurality of control circuits are configured to drive and control the one or the plurality of optical sub-assemblies.

An optical transmitter-receiver may include a metal box-shaped case configured to block unnecessary electromagnetic waves generated inside the case and reduce cavity resonance generated inside the case. The box-shaped case may include an upper case and a lower case. In view of processability and low cost, the upper case and the lower case are each formed integrally by die-casting, and are made of a material such as a zinc alloy or an aluminum alloy.

When the optical module is driven, the one or the plurality of optical sub-assemblies and the one or the plurality of control circuits generate heat. Thus, it is required that the generated heat be radiated from the optical module to the optical transmission equipment having the optical module mounted thereto. The optical module includes a housing configured to accommodate the one or the plurality of optical sub-assemblies and the one or the plurality of control circuits, and the generated heat is radiated from the housing to the optical transmission equipment. In order to improve heat radiation performance, the housing is made of a material such as metal having a relatively high thermal conductivity, and the optical transmission equipment includes a heat sink provided at a joining portion with the optical module. In recent years, along with an achievement of greater function of the optical module, high-density mounting is performed. A heat-generation amount of the optical module also increases. Under such circumstances, there has been a problem in that the box-shaped case in the related art cannot no more sufficiently radiate the generated heat to the outside.

SUMMARY

According to some possible implementations, an optical module includes at least one optical sub-assembly; at least one control circuit configured to control the at least one optical sub-assembly; and a housing including a first case and a second case, wherein the optical module is configured to be plugged in and unplugged from an optical transmission equipment including a heat sink provided at a joining portion with the first case, wherein, through fitting of the first case and the second case, the housing accommodates the at least one optical sub-assembly and the at least one control circuit inside the housing, and wherein a material of the first case has a thermal conductivity higher than a material of the second case.

According to some possible implementations, an optical transmission equipment includes optical module comprising: at least one optical sub-assembly; at least one control circuit configured to control the at least one optical sub-assembly; and a housing including a first case and a second case, wherein the optical module is configured to be plugged in and unplugged from an optical transmission equipment including a heat sink provided at a joining portion with the first case, wherein, through fitting of the first case and the second case, the housing accommodates the at least one optical sub-assembly and the at least one control circuit inside the housing, and wherein a material of the first case has a thermal conductivity higher than a material of the second case.

BRIEF DESCRIPTION OF THE DRAWINGS

FIG. 5 is a table for showing characteristics of materials used for an upper case or a lower case in the example.

DETAILED DESCRIPTION

The following detailed description of example implementations refers to the accompanying drawings. The same reference numbers in different drawings may identify the same or similar elements.

Figure 1:
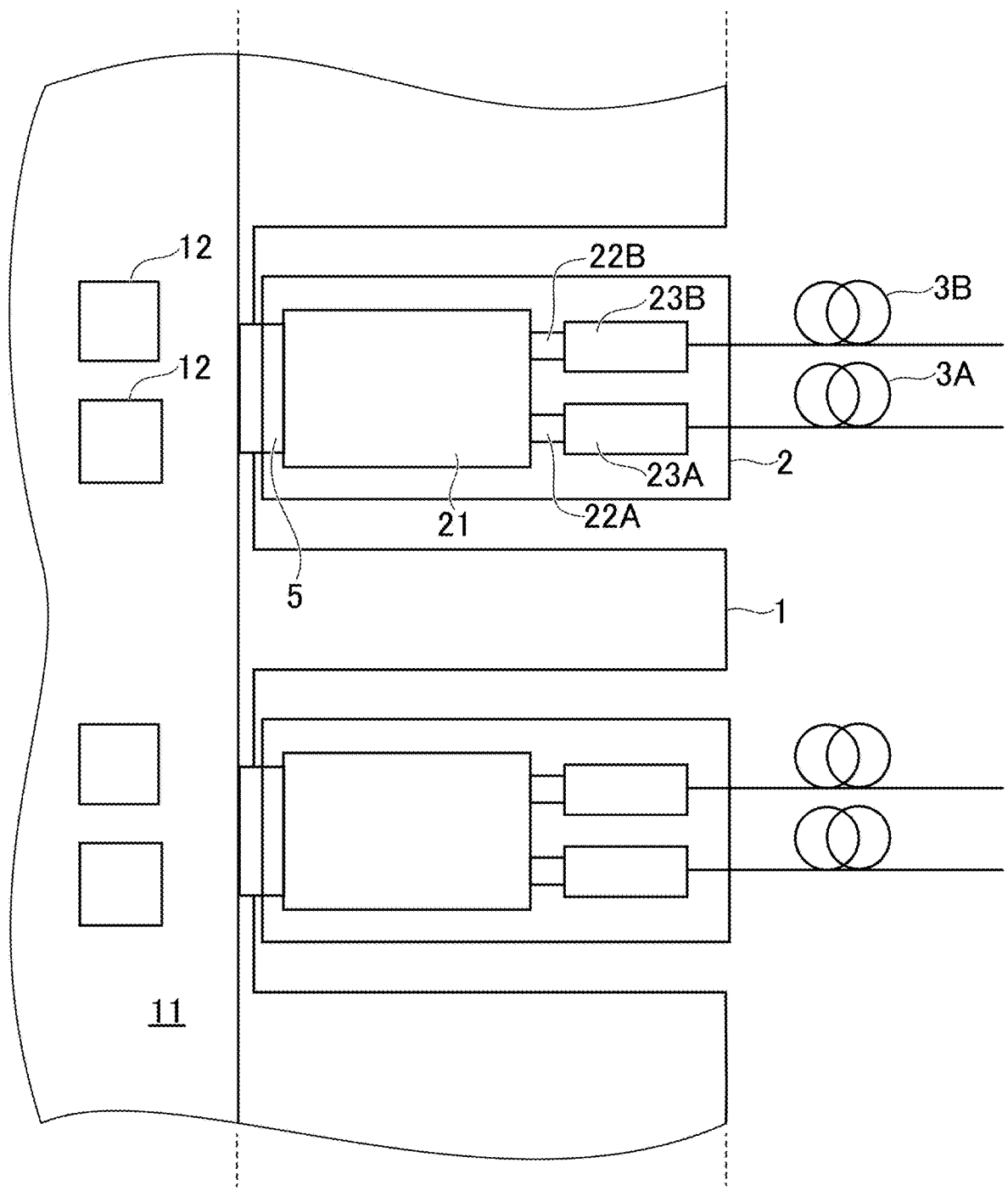
FIG. 1 is a schematic view for illustrating a configuration of an optical transmission equipment and an optical module according to an example.

FIG. 1 is a schematic view for illustrating a configuration of an optical transmission equipment 1 and an optical module 2 according to an implementation. The optical transmission equipment 1 includes a printed circuit board 11 and ICs 12. The optical transmission equipment 1 is, for example, a large-capacity router or a switch. The optical transmission equipment 1 has, for example, a function of a switchboard, and is provided in a base station or the like. A plurality of optical modules 2 are mounted to the optical transmission equipment 1. Reception data (reception electric signal) is acquired from the optical module 2. Determination of a destination and a kind of data to be transmitted is made through use of the ICs 12 or the like, and transmission data (transmission electric signal) is generated. Then, the data is transmitted to a corresponding one of the optical modules 2 through the printed circuit board 11.

The optical module 2 is a transceiver having a transmission function and a reception function. The optical module 2 includes a printed circuit board 21, an optical reception module 23A, and an optical transmission module 23B. The optical reception module 23A is configured to convert an optical signal received through an optical fiber 3A into an electric signal. The optical transmission module 23B is configured to convert the electric signal into an optical signal and transmit the optical signal to an optical fiber 3B. The printed circuit board 21 is connected to the optical reception module 23A and the optical transmission module 23B via flexible printed circuits 22A and 22B (FPC). The electric signal is transmitted from the optical reception module 23A to the printed circuit board 21 through the flexible board 22A, and the electric signal is transmitted from the printed circuit board 21 to the optical transmission module 23B through the flexible board 22B. The optical module 2 and the optical transmission equipment 1 are connected to each other via an electric connector 5. The optical reception module 23A and the optical transmission module 23B are electrically connected to the printed circuit board 21. The optical reception module 23A is configured to convert the optical signal into the electric signal, and the optical transmission module 23B is configured to convert the electric signal into the optical signal. The printed circuit board 21 includes a control circuit (for example, IC) configured to control the electric signal transmitted from the optical reception module 23A and a control circuit (for example, IC) configured to control the electric signal transmitted to the optical transmission module 23B.

An optical transmission system according to an implementation includes two or more optical transmission equipments 1, two or more optical modules 2, and one or more optical fibers 3 (not shown; for example, optical fibers 3A and 3B). One or more optical modules 2 are connected to each optical transmission equipment 1. The optical fibers 3 connect the optical modules 2 respectively connected to two optical transmission equipments 1. Transmission data generated by one optical transmission equipment 1 is converted into an optical signal by the optical module 2 connected to the one optical transmission equipment 1, and the optical signal is transmitted to the optical fiber 3. The optical signal transmitting on the optical fiber 3 is received by the optical module 2 connected to another optical transmission equipment 1, and the optical module 2 converts the optical signal into an electric signal and transmits the electric signal as reception data to the another optical transmission equipment 1.

Figure 2:
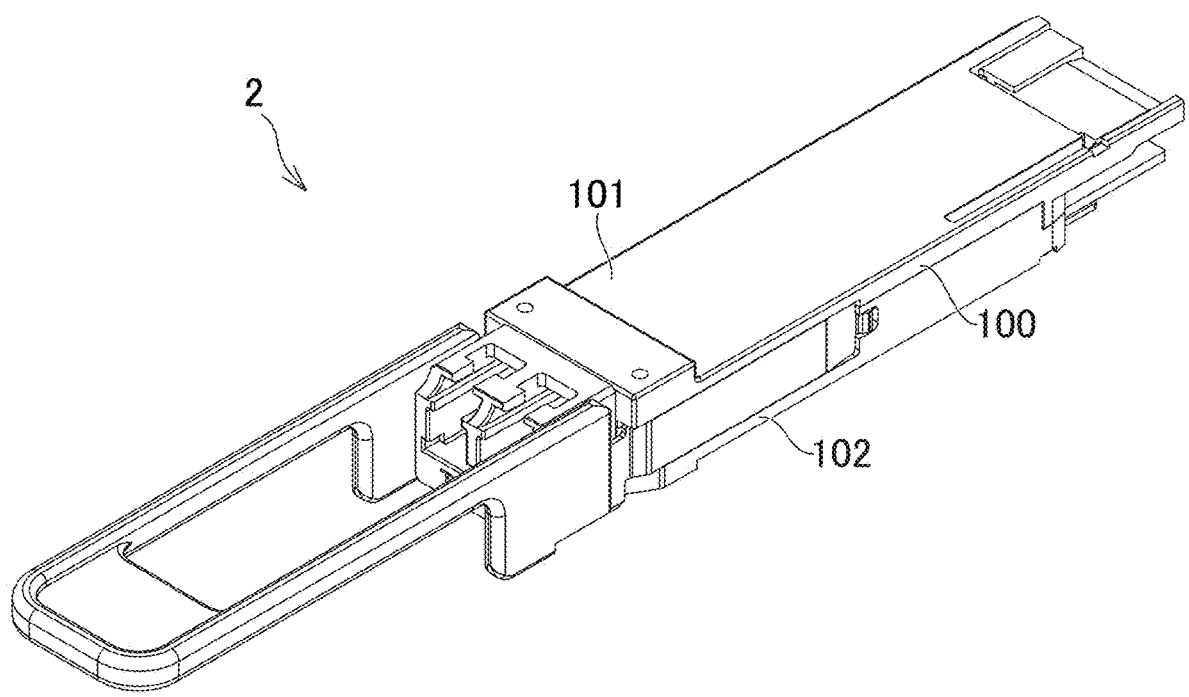
FIG. 2 is an exterior view of the optical module according to the example.

FIG. 2 is an exterior view of the optical module 2. The optical module 2 conforms to QSFP-DD (MSA standard), and a transmission rate of the optical module 2 is 400 Gbit/s. As illustrated in FIG. 2, the optical module 2 includes a housing 100. The housing 100 includes an upper case 101 (first case) and a lower case 102 (second case).

Figure 3:
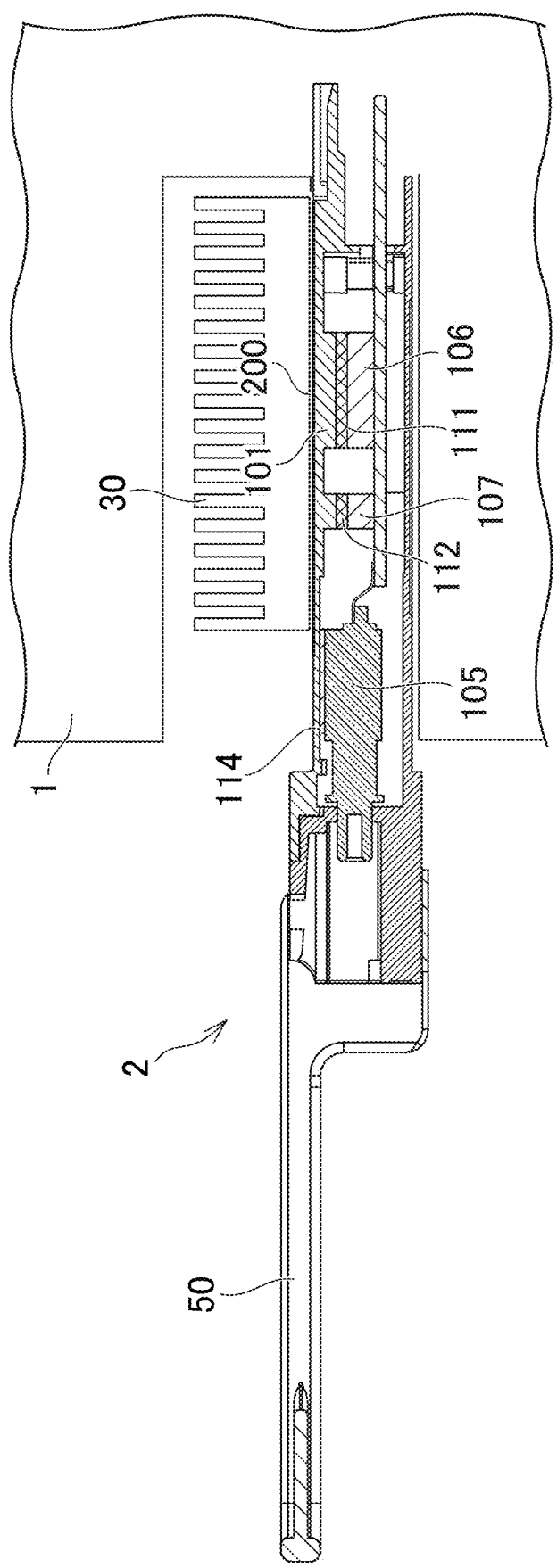
FIG. 3 is a sectional view for illustrating a joining portion between the optical transmission equipment and the optical module according to the example.

FIG. 3 is a schematic sectional view for illustrating a joining portion 200 between the optical transmission equipment 1 and the optical module 2. The optical transmission equipment 1 includes a heat sink 30 provided at the joining portion 200 between the optical module 2 and the uppercase 101. When the optical module 2 is mounted to the optical transmission equipment 1, the upper case 101 and the heat sink 30 are brought into physical contact with each other at the joining portion 200 between the optical transmission equipment 1 and the optical module 2. The optical module 2 further includes a pull-tab 50 provided at an end portion of the optical module 2 on a side on which the optical module 2 is connected to the optical fiber. When the optical module 2 is to be plugged in and unplugged from the optical transmission equipment 1, a user may use the pull-tab 50. In particular, the pull-tab 50 is useful when the optical module 2 is to be unplugged (removed).

Figure 4:
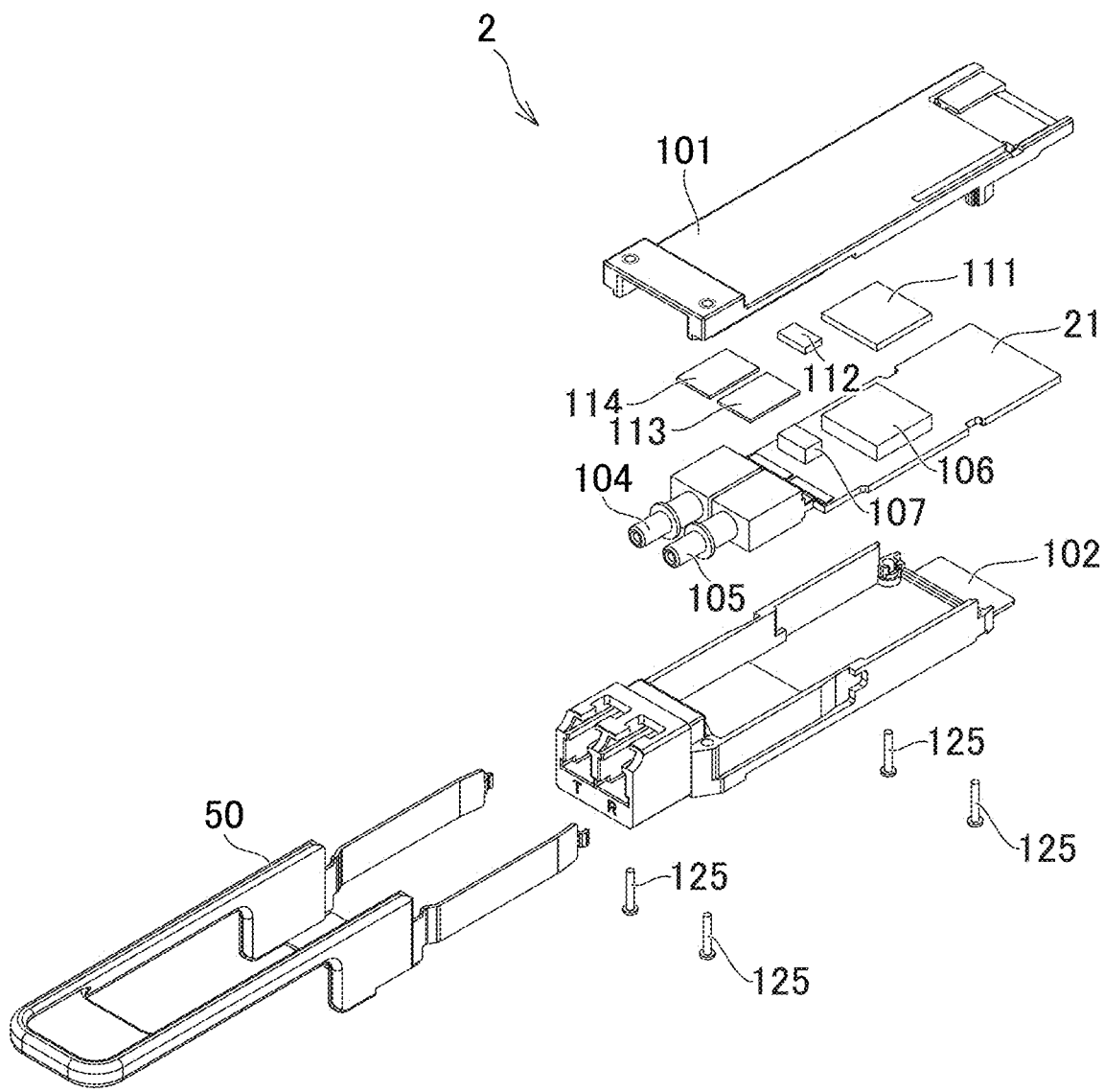
FIG. 4 is a perspective view for illustrating a configuration of the optical module according to the example.

FIG. 4 is a perspective view for illustrating a configuration of the optical module 2. An illustration is given of main components accommodated inside the optical module 2 under a state in which the upper case 101 and the lower case 102 are separated from each other. For simplicity, only the main components are illustrated, and other components are omitted in their illustrations. As illustrated in FIG. 4, the optical module 2 includes two optical sub-assemblies 104 and 105 (one or a plurality of optical sub-assemblies). Although one or a plurality of optical sub-assemblies are provided in general, the optical reception module 23A illustrated in FIG. 1 includes one optical sub-assembly 104. The optical sub-assembly 104 is a receiver optical sub-assembly (ROSA) including four 100-Gbit/s-class (more specifically, 50-GBaud-class with PAM4 signal) receiving elements. That is, the optical sub-assembly 104 has four or four-wave optical inputs and four channels of electric outputs corresponding to the optical inputs. Although one or a plurality of optical sub-assemblies are provided in general, the optical transmission module 23B illustrated in FIG. 1 includes one optical sub-assembly 105. The optical sub-assembly 105 is a transmitter optical sub-assembly (TOSA) including four 100-Gbit/s-class (more specifically, 50-GBaud-class with PAM4 signal) light-emitting elements. That is, the optical sub-assembly 105 has four channels of electrical inputs and four or four-wave optical outputs corresponding to the electrical inputs. The optical sub-assemblies 104 and 105 each includes a housing having a box shape.

The optical module 2 further includes control ICs 106 and 107 arranged on the printed circuit board 21. The control ICs 106 and 107 correspond to one or a plurality of control circuits configured to control the one or the plurality of optical sub-assemblies. Specifically, the control IC 106 is a digital signal processor (DSP), and the control IC 107 is a driver IC. The printed circuit board 21 further includes electrical components which are not illustrated. The printed circuit board 21 is accommodated in the lower case 102. The optical module 2 further includes heat-radiation sheets 111, 112, 113, and 114. The heat-radiation sheets 111 and 112 are affixed to upper surfaces of the control ICs 106 and 107, respectively. The heat-radiation sheets 111 and 112 are first heat-radiation materials which are arranged between the one or the plurality of control circuits and the first case so as to be brought into physical contact with the one or the plurality of control circuits and the first case. The heat-radiation sheets 113 and 114 are affixed to upper surfaces of the box-shaped housings of the optical sub-assemblies 104 and 105, respectively. That is, the heat-radiation sheets 113 and 114 are affixed to at least part of the upper surfaces of the optical sub-assemblies 104 and 105, respectively. The heat-radiation sheets 113 and 114 are second heat-radiation materials which are arranged between the one or the plurality of optical sub-assemblies and the first case so as to be brought into physical contact with the one or the plurality of optical sub-assemblies and the first case.

Through fitting of the upper case 101 and the lower case 102 to each other, the housing 100 accommodates the one or the plurality of optical sub-assemblies (e.g., optical sub-assemblies 104 and 105) and the one or the plurality of control circuits (control ICs 106 and 107) inside the housing 100. Under the state in which the upper case 101 and the lower case 102 are fitted to each other, the heat-radiation sheets 111, 112, 113, and 114 are brought into physical contact with an inner (lower) surface of the uppercase 101.

In order to allow the inner (lower) surface of the upper case 101 to be brought into physical contact with the optical sub-assemblies 104 and 105 and the control ICs 106 and 107 through intermediation of the heat-radiation sheets 111, 112, 113, and 114, the inner surface of the upper case 101 is processed to have protrusions and recesses conforming to shapes of the optical sub-assemblies 104 and 105 and the control ICs 106 and 107. The heat-radiation sheets 111, 112, 113, and 114 are thermally conductive sheets made of a silicon-based material or an acrylic material containing fillers having a high thermal conductivity, and are heat-radiation materials for conducting heat generated in the optical sub-assemblies 104 and 105 and the control ICs 106 and 107 at the time of driving to the uppercase 101. The heat-radiation materials are not limited to the heat-radiation sheets, and may be heat-radiation grease. The uppercase 101 and the lower case 102 are fixed to each other through use of mounting screws 125.

The optical module 2 has a main feature that a material of the upper case 101 (first case) has a thermal conductivity higher than that of a material of the lower case 102 (second case). It is preferred that the material of the upper case 101 be copper. It is preferred that the material of the lower case 102 be the one selected from the group consisting of a zinc alloy, an aluminum alloy, and a magnesium alloy. The material of the uppercase 101 has the thermal conductivity higher than that of the material of the lower case 102, and hence the upper case 101 is considered as a member with a great deal of importance attached to the heat radiation performance. As a result, the following special effect is attained. Specifically, when the optical module 2 is mounted to the optical transmission equipment 1 and is then driven, more heat generated inside the optical module 2 can be radiated to the heat sink 30 of the optical transmission equipment 1 through the upper case 101 having a higher thermal conductivity.

FIG. 5 is a table for showing characteristics of materials used for the upper case 101 and the lower case 102. The both aluminum alloys and the zinc alloy are materials of the lower case 102, and the copper is a material of the upper case 101. Kinds of alloys are described in parenthesis next to the aluminum alloys and the zinc alloy. As shown in FIG. 5, the thermal conductivity of the material (copper) of the upper case 101 is higher than the thermal conductivity of each of the materials of the lower case 102. Further, with regard to processing methods, the upper case 101 is formed by metal injection molding (MIM) or machining, and the lower case 102 is formed by die-casting or machining. The kind of the zinc alloy shown in FIG. 5 is an example, and other material such as ZAMAK3, ZAMAK5, ZDC1, or ZDC2 may be used. As compared to those materials, the copper has a higher thermal conductivity.

The copper is higher in cost for processing as compared to the zinc alloy and the aluminum alloy, but has a higher thermal conductivity and is excellent in heat radiation performance. Through use of the copper as the material of the uppercase 101, the heat radiation performance with respect to the heat sink 30 can be enhanced. Meanwhile, through use of any one of the zinc alloy, the aluminum alloy, and the magnesium alloy as the material of the lower case 102, there can be achieved a structure giving higher priority to low cost for the processing than to the heat radiation performance. In other words, low cost can be achieved as compared to a case in which the copper is used as the material of both the upper case 101 and the lowercase 102.

Figure 6:
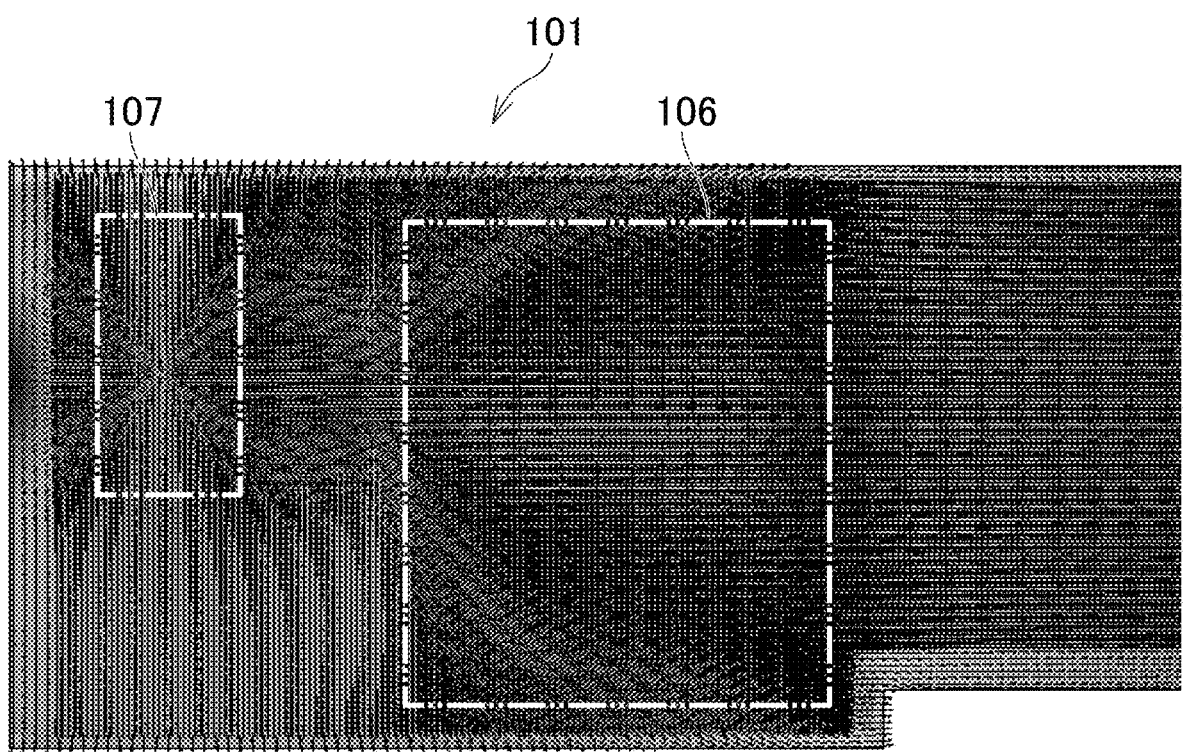
FIG. 6 shows an inner-wall thermal flux in the upper case in the example.
Figure 7:
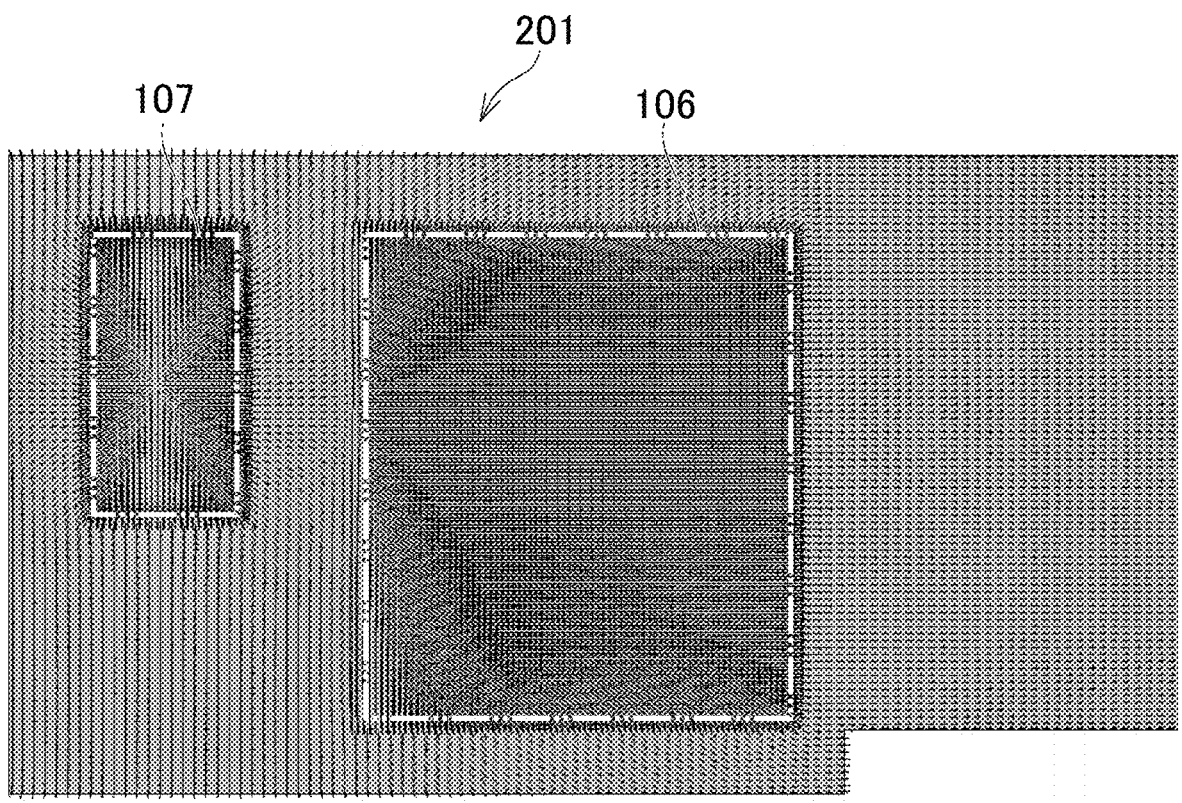
FIG. 7 shows an inner-wall thermal flux in an upper case.

FIG. 6 shows an inner-wall thermal flux in the uppercase 101. FIG. 7 shows an inner-wall thermal flux in an uppercase 201. As mentioned above, the uppercase 101 may be formed with use of copper. In contrast, the upper case 201 in the related art is formed with use of a zinc alloy (ZAMAK3). An optical module in the related art has the same configuration as the optical module 2 except for a configuration of the uppercase 201. FIG. 6 and FIG. 7 each show a result of simulation through use of a calculator on an inner-wall thermal flux at a main portion of the upper case. On an inner wall of the upper case 201 in the related art, shapes of the control ICs 106 and 107 can be recognized. The heat generated in the control ICs 106 and 107 does not flow out to the entirety of the inner wall of the upper case, and the generated heat is locally present above the control ICs 106 and 107. In contrast, on an inner wall of the upper case 101, the heat generated in the control ICs 106 and 107 flows out to the entirety of the inner wall of the upper case to the extent that the shapes of the control ICs 106 and 107 cannot be clearly recognized. It can be seen that, as compared to the optical module in the related art, more heat generated inside the optical module 2 is radiated to the outside.

In order to improve the heat transfer performance between the upper case 101 and the heat sink 30, the surface of the upper case 101 may also be ground to reduce flatness or smoothen (reduce surface roughness). Here, the "flatness" is a magnitude of a deviation from a geometrically correct plane of a planar body. Moreover, the "surface roughness" represents a state (unevenness) of a processed surface of a component, and is a degree of roughness of a cyclical shape including continuous mountains and valleys having different heights, depths, and distances. The lower case 102 can also be reduced in flatness or smoothened by surface grinding after die-casting, but such processing is disadvantageous in terms of cost. Meanwhile, the upper case 101 is made of copper which requires higher processing cost as compared to the lower case 102, and the processing cost is further increased when the surface grinding is performed. However, as compared to a die-cast of a zinc alloy without surface grinding, the heat radiation performance can be significantly improved, thereby being capable of achieving low power consumption. The portion of the upper surface of the upper case 101 joined to the heat sink 30 is lower in surface roughness and lower in flatness than the outer surface of the lower case 102.

In the above, a description has been given of the optical module, the optical transmission equipment, and the optical transmission system according to an implementation. The configuration described in the implementation may be replaced by substantially the same structure, a structure having the same action and effect, or a structure which may achieve the same object.

In the implementations described above, the optical module 2 conforms to the QSFP-DD. However, the implementations are not limited thereto. The optical module 2 may conform to other standard.

According to some implementations, the material of the upper case 101 (first case) is copper. As long as the material has a higher thermal conductivity than that of the material of the lower case 102 (second case), the upper case 101 may be formed with use of other material. For example, the material may be a copper tungsten alloy (CuW). In the implementation described above, the control circuits are the DSP and the driver IC, but are not limited thereto and may be other configuration.

In the implementation described above, the heat-radiation sheets 111 and 112 are arranged so as to be brought into physical contact with each of the upper surfaces of the control ICs 106 and 107 and the lower surface of the upper case 101, and the heat-radiation sheets 113 and 114 are arranged so as to be brought into physical contact with each of the upper surfaces of the optical sub-assemblies 104 and 105 and the lower surface of the upper case 101. The one or the plurality of optical sub-assemblies and the one or the plurality of control circuits may be brought into physical contact with the first case, or the one or the plurality of optical sub-assemblies and the one or the plurality of control circuits may be thermally connected to the first case through intermediation of other substance. It should be noted that the other substance does not include gas such as air.

In the implementation described above, the optical module 2 includes the optical assemblies 104 and 105 each having four channels. One or a plurality of optical sub-assemblies may be provided. In the implementation described above, the housings of the optical sub-assemblies 104 and 105 each have a box shape. The housings of the optical sub-assemblies may each have a cylindrical shape. Moreover, the optical module 2 may be limited to have only any one of the optical transmission function and the optical reception function. That is, the optical module 2 may include only any one of an optical transmission sub-assembly or an optical reception sub-assembly.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An optical module comprising:
a housing including a first case and a second case, wherein
the first case is configured to physically contact a heat sink of an optical transmission equipment,
the first case is made of a first material that has a first thermal conductivity, and
the second case is made of a second material that has a second thermal conductivity,
wherein the first thermal conductivity is higher than the second thermal conductivity;
an optical sub-assembly arranged within the housing and configured for connection to an optical fiber;
a control circuit arranged within the housing and configured to control the optical sub-assembly;
a first heat-radiation material arranged between the optical sub-assembly and the first case; and
a second heat-radiation material arranged between the control circuit and the first case.

2. The optical module of claim 1, wherein the first material is copper.

3. The optical module of claim 1, wherein the second material is one of a zinc alloy, an aluminum alloy, or a magnesium alloy.

4. The optical module of claim 1, wherein
the first heat-radiation material physically contacts the optical sub-assembly and the first case; and
the second heat-radiation material physically contacts the control circuit and the first case.

5. The optical module of claim 1, wherein a portion of an upper surface of the first case has a first surface roughness that is lower than a second surface roughness of an outer surface of the second case.

6. The optical module of claim 1, wherein a portion of an upper surface of the first case has a first flatness that is lower than a second flatness of an outer surface of the second case.

7. The optical module of claim 1, wherein
the optical sub-assembly is a first optical sub-assembly and the optical fiber is a first optical fiber; and
the optical module further comprises:
a second optical sub-assembly arranged within the housing and configured for connection to a second optical fiber.

8. The optical module of claim 7, further comprising:
a third heat-radiation material arranged between the second optical sub-assembly and the first case.

9. The optical module of claim 7, wherein
the control circuit is a first control circuit; and
the optical module further comprises:
a second control circuit arranged within the housing and configured to control the second optical sub-assembly.

10. The optical module of claim 9, further comprising:
a fourth heat-radiation material arranged between the second control circuit and the first case.

11. An optical transmission assembly comprising:
an optical transmission equipment that includes a heat sink; and
an optical module that is configured to be plugged in and unplugged from the optical transmission equipment, the optical module comprising:
a housing including a first case and a second case, wherein
the first case is configured to physically contact the heat sink when the optical module is plugged in the optical transmission equipment,
the first case is made of a first material that has a first thermal conductivity, and
the second case is made of a second material that has a second thermal conductivity,
wherein the first thermal conductivity is higher than the second thermal conductivity;
an optical sub-assembly arranged within the housing and configured for connection to an optical fiber;

a control circuit arranged within the housing and configured to control the optical sub-assembly;
a first heat-radiation material arranged between the optical sub-assembly and the first case; and
a second heat-radiation material arranged between the control circuit and the first case.

12. The optical transmission assembly of claim 11, wherein the first material is copper.

13. The optical transmission assembly of claim 11, wherein the second material is one of a zinc alloy, an aluminum alloy, or a magnesium alloy.

14. The optical transmission assembly of claim 11, wherein
the first heat-radiation material physically contacts the optical sub-assembly and the first case; and
the second heat-radiation material physically contacts the control circuit and the first case.

15. The optical transmission assembly of claim 11, wherein a portion of an upper surface of the first case has a first surface roughness that is lower than a second surface roughness of an outer surface of the second case.

16. The optical transmission assembly of claim 11, wherein a portion of an upper surface of the first case has a first flatness that is lower than a second flatness of an outer surface of the second case.

17. The optical transmission assembly of claim 11, wherein
the optical sub-assembly is a first optical sub-assembly and the optical fiber is a first optical fiber; and
the optical module further comprises:
a second optical sub-assembly arranged within the housing and configured for connection to a second optical fiber.

18. The optical transmission assembly of claim 17, wherein the optical module further comprises:
a third heat-radiation material arranged between the second optical sub-assembly and the first case.

19. The optical transmission assembly of claim 17, wherein
the control circuit is a first control circuit; and
the optical module further comprises:
a second control circuit arranged within the housing and configured to control the second optical sub-assembly.

20. The optical transmission assembly of claim 19, wherein the optical module further comprises:
a fourth heat-radiation material arranged between the second control circuit and the first case.

* * * * *